US012757318B2

(12) United States Patent
Sung et al.

(10) Patent No.: US 12,757,318 B2
(45) Date of Patent: Oct. 6, 2026

(54) CIRCUIT BOARD

(71) Applicant: DONGWOO FINE-CHEM CO., LTD., Jeollabuk-do (KR)

(72) Inventors: Ki Hun Sung, Jeollabuk-do (KR); Dae Kyu Kim, Jeollabuk-do (KR); Hee Jun Park, Jeollabuk-do (KR); Sung Joon Hong, Jeollabuk-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 170 days.

(21) Appl. No.: 18/407,621

(22) Filed: Jan. 9, 2024

(65) Prior Publication Data

US 2024/0268017 A1 Aug. 8, 2024

(30) Foreign Application Priority Data

Feb. 3, 2023 (KR) ........................ 10-2023-0014660

(51) Int. Cl.
*H05K 1/02* (2006.01)
*H05K 1/11* (2006.01)

(52) U.S. Cl.
CPC ........... *H05K 1/0224* (2013.01); *H05K 1/116* (2013.01)

(58) Field of Classification Search
CPC ................. H05K 1/0224; H05K 1/116; H05K 2201/09336; H05K 1/0251; H05K 2201/09618; H05K 2201/09727; H05K 1/115; H05K 1/0218; H05K 2201/0939
USPC ......................................................... 174/262
See application file for complete search history.

(56) References Cited

U.S. PATENT DOCUMENTS

2006/0125573 A1* 6/2006 Brunette .............. H05K 1/0251 333/33
2008/0121421 A1* 5/2008 Kashiwakura ......... H05K 1/116 174/262
2009/0015345 A1* 1/2009 Kushta ................. H05K 1/0251 333/34
2013/0175077 A1* 7/2013 Kim ....................... H05K 1/114 174/262
2015/0222003 A1* 8/2015 Fujita ........................ H01P 1/04 333/238

FOREIGN PATENT DOCUMENTS

KR 10-2013-0095451 A 8/2013
KR 10-2022-0071806 A 5/2022

OTHER PUBLICATIONS

Office action issued on Mar. 18, 2026 from Korean Patent Office in a counterpart Korean Patent Application No. 10-2023-0014660 (all the cited references are listed in this IDS.) (English translation is also submitted herewith.).

* cited by examiner

*Primary Examiner* — Timothy J Thompson
*Assistant Examiner* — Sidi M Maiga
(74) *Attorney, Agent, or Firm* — The PL Law Group, PLLC

(57) ABSTRACT

A circuit board includes a core layer, a first via structure penetrating the core layer, a circuit wiring disposed on one surface of the core layer and including a head portion in contact with the first via structure, a connection portion extending from the head portion and an extension portion electrically connected to the head portion through the connection portion, and a first ground pattern disposed on the one surface of the core layer and disposed around the circuit wiring to be spaced apart from the circuit wiring. A shortest distance between the extension portion and the first ground pattern is greater than a shortest distance between the head portion and the first ground pattern.

14 Claims, 5 Drawing Sheets

CIRCUIT BOARD

CROSS-REFERENCE TO RELATED APPLICATION AND CLAIM OF PRIORITY

This application claims the benefit under 35 USC § 119 of Korean Patent Application No. 10-2023-0014660 filed on Feb. 3, 2023, in the Korean Intellectual Property Office (KIPO), the entire disclosure of which is incorporated herein by reference for all purposes.

BACKGROUND

1. Field

The present invention relates to a circuit board.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

Recently, as mobile communication technologies have been developed, an antenna for a communication in a high frequency or an ultra-high frequency band is needed in the image display device.

However, as a driving frequency of the antenna increases, a signal loss may increase. The signal loss may be further increased as a length of a transmission path increases.

To connect the antenna to, e.g., a main board of the image display device, a circuit board including a connection intermediate structure such as a circuit wiring and a via structure may be used. In this case, the signal loss and a phase difference between circuits may be further increased by the connection intermediate structure.

For example, the driving frequency band of the antenna has been recently increased, the signal loss may be increased. Accordingly, signal transmission efficiency and reliability may be relatively deteriorated.

SUMMARY

According to an aspect of the present invention, there is provided a circuit board having improved reliability.

(1) A circuit board, including a core layer: a first via structure penetrating the core layer: a circuit wiring disposed on one surface of the core layer, the circuit wiring including a head portion in contact with the first via structure, a connection portion extending from the head portion, and an extension portion electrically connected to the head portion through the connection portion; and a first ground pattern disposed on the one surface of the core layer and disposed around the circuit wiring to be spaced apart from the circuit wiring, wherein a shortest distance between the extension portion and the first ground pattern is greater than a shortest distance between the head portion and the first ground pattern.

(2) The circuit board of the above (1), further including a via land disposed on the other surface of the core layer and electrically connected to the head portion through the first via structure.

(3) The circuit board of the above (2), wherein the via land is formed integrally with the head portion and the first via structure.

(4) The circuit board of the above (2), further including a second ground pattern disposed on the other surface of the core layer and disposed around the via land to be spaced apart from the via land.

(5) The circuit board of the above (4), further including a second via structure penetrating the core layer to electrically connect the first ground pattern and the second ground pattern.

(6) The circuit board of the above (1), wherein the shortest distance between the extension portion and the first ground pattern is greater than a shortest distance between the connection portion and the first ground pattern.

(7) The circuit board of the above (1), wherein a width of the head portion is greater than each of a width of the extension portion and a width of the connection portion.

(8) The circuit board of the above (1), wherein a width of the connection portion is greater than or equal to a width of the extension portion.

(9) The circuit board of the above (1), further including a separation space in a trench shape formed between the first ground pattern and the circuit wiring.

(10) The circuit board of the above (1), wherein the first ground pattern includes a first recess and a second recess formed around the connection portion to face each other with the connection portion there between.

(11) The circuit board of the above (10), wherein the connection portion includes one end portion directly connected to the head portion, and the first recess and the second recess are adjacent to the one end portion of the connection portion.

(12) The circuit board of the above (10), wherein a shortest distance between the connection portion and the first recess and a shortest distance between the connection portion and the second recess are each smaller than the shortest distance between the extension portion and the first ground pattern.

(13) The circuit board of the above (10), wherein the first recess and the second recess are each spaced apart from the extension portion in an extension direction of the circuit wiring.

(14) The circuit board of the above (10), wherein the connection portion includes an inclined portion having an increasing width in a direction from the extension portion to the head portion.

(15) The circuit board of the above (14), wherein a shortest distance between the connection portion and the first recess and a shortest distance between the connection portion and the second recess are each smaller than the shortest distance between the head portion and the first ground pattern.

According to example embodiments of the present invention, a circuit board includes a circuit wiring including a head portion, a connection portion and an extension portion, a first via structure, and a first ground pattern. The head portion may contact the first via structure. The shortest distance between the extension portion and the first ground pattern may be greater than the shortest distance between the head portion and the first ground pattern. Accordingly, a signal loss at the head portion in contact with the first via structure may be prevented while improving an impedance matching of the circuit wiring.

In some embodiments, the first ground pattern may include a first recess and a second recess which may be formed to face each other with the connection portion interposed therebetween around the connection portion. Accordingly, signal noises transmitted and received between the connection portion and the head portion may be further shielded, and the signal loss may be further reduced.

DETAILED DESCRIPTION OF THE EMBODIMENTS

According to exemplary embodiments of the present invention, a circuit board including a circuit wiring and a via structure is provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
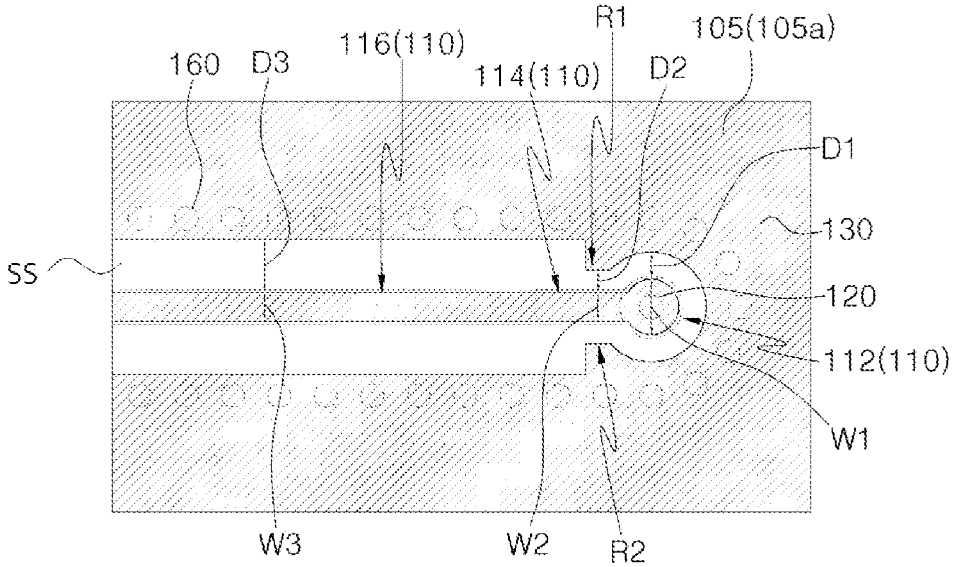
FIGS. 1 and 2 are a schematic plan view and a schematic cross-sectional view, respectively, illustrating a circuit board in accordance with exemplary embodiments.
Figure 2:
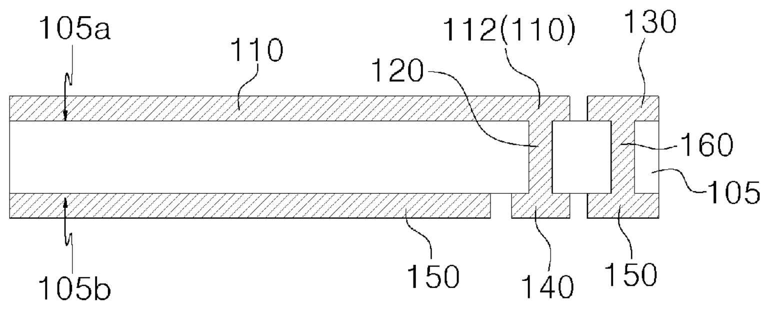

FIGS. 1 and 2 are a schematic plan view and a schematic cross-sectional view, respectively, illustrating a circuit board in accordance with exemplary embodiments.

Referring to FIGS. 1 and 2, a circuit board includes a core layer 105, a circuit wiring 110, a first via structure 120 penetrating the core layer 105, and a first ground pattern 130. The first ground pattern 130 may be disposed around the circuit wiring 110 and may be spaced apart from the circuit wiring 110.

For example, the core layer 105 may include a flexible resin such as a polyimide resin, a modulated polyimide (MPI), an epoxy resin, polyester, a cycloolefin polymer (COP), a liquid crystal polymer (LCP), etc. For example, the core layer 105 may include an inner insulating layer included in the circuit board.

The core layer 105 may include one surface 105*a* and the other surface 105*b* facing each other.

In example embodiments, the circuit wiring 110 and the first ground pattern 130 may be disposed on the one surface 105*a* of the core layer.

The circuit wiring 110 may include a head portion 112 in contact with the first via structure 120, a connection portion 114 extending from the head portion 112 and an extension portion 116 electrically connected to the head portion 112 via the connection portion 114.

For example, the head portion 112, the connection portion 114 and the extension portion 116 may be substantially integrally formed in a single member.

In some embodiments, the head portion 112 may have a substantially circular shape. Accordingly, a separation distance from the center of the head portion 112 to the first ground pattern 130 may be substantially uniform. Therefore, noise shielding and signal loss prevention may be uniformly implemented around the first via structure 120.

The head portion 112 may be in a direct contact with the first via structure 120 to transmit a signal to the first via structure 120, or may receive a signal from the first via structure 120. The signal may be transmitted to a target receiver through the head portion 112, the connection portion 114 and the extension portion 116.

For example, the extension portion 116 may have a uniform width and may serve as an electrode line.

For example, the connection portion 114 may be disposed between the head portion 112 and the extension portion 116 to connect the head portion 112 and the extension portion 116 with each other.

In some embodiments, a width W1 of the head portion 112 may be greater than each of a width W3 of the extension portion 116 and a width W2 of the connection portion 114. Accordingly, a resistance may be reduced in a contact region between the head portion 112 and the first via structure 120 and a signal loss may be prevented.

In some embodiments, the width W2 of the connection portion 114 may be equal to or greater than the width W3 of the extension portion 116. In an embodiment, the width W2 of the connection portion 114 may be substantially equal to the width W3 of the extension portion 116.

The width W1 of the head portion 112 may refer to a diameter of the head portion 112 having the circular shape. For example, the width W1 of the head portion 112 may refer to a length of the head portion 112 in a direction perpendicular to the extending direction of the circuit wiring 110.

The width W2 of the connection portion 114 may refer to the largest line width among line widths of the connection portion 114.

The width W3 of the extension portion 116 may refer to a line width of the extension portion 116.

As illustrated in FIG. 2, the circuit board may further include a via land 140 disposed on the other surface 105*b* of the core layer.

The via land 140 may be electrically connected to the head portion 112 through the first via structure 120. The via land 140 may be electrically connected to, e.g., an antenna device, an external intermediate structure, a driving integrated circuit (IC) chip, etc. Accordingly, the circuit wiring may be electrically connected to the antenna element, the external intermediate structure, the driving IC chip, etc.

The external intermediate structure may include, e.g., a flexible printed circuit board (FPCB), a connector, etc.

Figure 3:
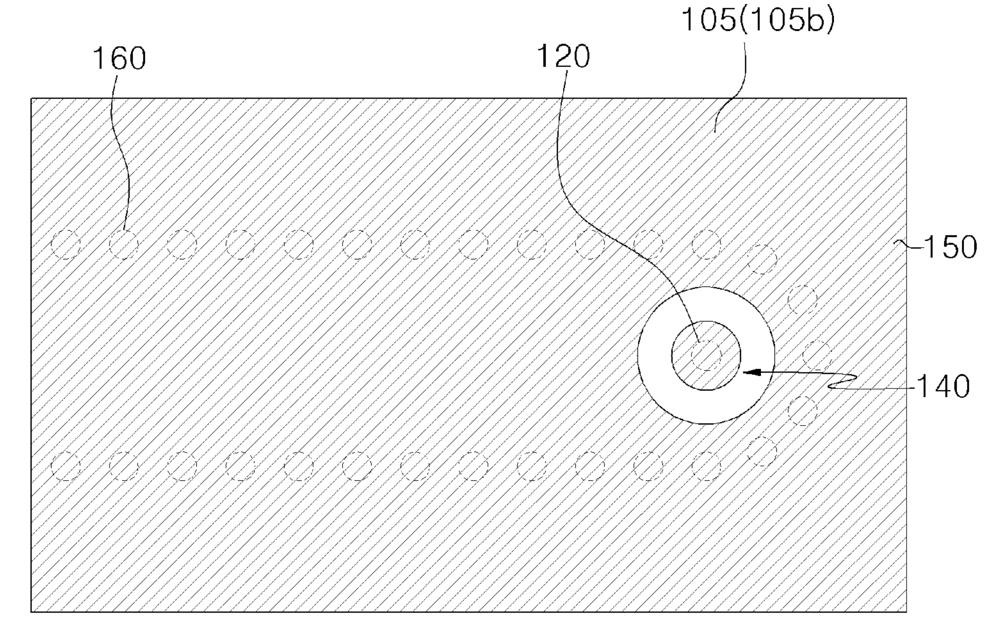
FIG. 3 is a schematic plan view illustrating a circuit board in accordance with exemplary embodiments.

FIG. 3 is a schematic plan view illustrating a circuit board in accordance with exemplary embodiments.

Referring to FIG. 3, a second ground pattern 150 may be disposed on the other surface 105*b* of the core layer.

For example, the second ground pattern 150 may be disposed around the via land 140 to be spaced apart from the via land 140. Thus, the noise shielding effect of the signals transmitted and received through the first via structure 120 may be improved.

In some embodiments, the circuit board may further include a second via structure 160 that may penetrate the core layer 105 to electrically connect the first ground pattern 130 and the second ground pattern 150 with each other. Accordingly, signal consistency in one surface 105*a* and the other surface 105*b* of the core layer may be improved, and signal loss may be suppressed.

For example, the second via structure 160 may overlap each of the first ground pattern 130 and the second ground pattern 150 in a plan view.

For example, the second via structure 160, the first ground pattern 130 and the second ground pattern 150 may be substantially integrally formed in a single member.

In some embodiments, a plurality of second via structures 160 overlapping the first ground pattern 130 and the second ground pattern 150 in the plan view and being adjacent to the circuit wiring 110 may be formed. Accordingly, impedance matching and noise shielding may be improved.

The circuit wiring 110, the first via structure 120, the first ground pattern 130, the second via structure 160, the second via pattern 150, and/or the via land 140 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Zn), tin (Sn), molybdenum (Mo), calcium (Ca), or an alloy containing at least one therefrom. These may be used alone or in a combination of two or more therefrom.

In an embodiment, the circuit wiring 110, the first via structure 120, the first ground pattern 130, the second via structure 160, the second via pattern 150 and/or the via land 140 may include silver (Ag) or a silver alloy (e.g., silver-palladium-copper (APC)), or copper (Cu) or a copper alloy (e.g., a copper-calcium (CuCa)) to implement a low feeding resistance and a fine line width pattern.

For example, the circuit wiring 110, the first via structure 120, the first ground pattern 130, the second via structure 160, the second ground pattern 150 and/or the via land 140 may be formed as a solid pattern to reduce a feeding and prevent a signal loss.

In an embodiment, the circuit wiring 110 and/or the head portion 112, the first via structure 120 and the via land 140 may be integrally formed as a single member. For example, a via hole penetrating the core layer 105 may be formed, and the above-described metal or alloy may be coated and patterned to form the circuit wiring 110 and/or the head portion 112 and the first via structure 120 and via land 140 as an integral member.

For example, the via land 140 may overlap the head portion 112 in the plan view.

In example embodiments, a shortest distance D3 between the extension portion 116 and the first ground pattern 130 may be greater than a shortest distance D1 between the head portion 112 and the first ground pattern 130. Accordingly, an impedance matching of the circuit wiring 110 may be improved while suppressing the signal loss in the head portion 112 in contact with the first via structure 120.

The term "shortest distance" used herein may refer to a straight line distance between an outermost portion of one element adjacent to the other element and an outermost portion of the other element adjacent to the one element.

For example, the shortest distance D1 between the head portion 112 and the first ground pattern 130 may refer to a linear distance between an outermost portion adjacent to the first ground pattern 130 of the head portion 112 and an outermost portion adjacent to the head portion 112 of the first ground pattern 130.

In some embodiments, the shortest distance D3 between the extension portion 116 and the first ground pattern 130 may be greater than a shortest distance D2 between the connection portion 114 and the first ground pattern 130. Accordingly, a distance between the circuit wiring 110 and the first ground pattern 130 may be further reduced in a periphery of a portion where a width of the circuit wiring 110 changes. Thus, the signal loss in the circuit wiring 110 may be further suppressed.

In example embodiments, a trench-shaped separation space SS may be formed between the first ground pattern 130 and the circuit wiring 110. Accordingly, loss of the signal transmitted through the circuit wiring 110 may be prevented, and the noise shielding may be implemented.

For example, signal loss around the first via structure 120 and the head portion 112 may be further prevented by adjusting the shape of the separation space SS.

The shape of the separation space SS may be changed by adjusting a patterning shape of the first ground pattern 130.

In some embodiments, the first ground pattern 130 may include a first recess R1 and a second recess R2 formed around the connecting portion 114 to face each other with the connection portion 114 interposed therebetween. Accordingly, noise of signals transmitted and received between the connection portion 114 and the head portion 112 may be further shielded, and the signal loss may be further reduced.

For example, one end portion of the connection portion 114 may be directly connected to the head portion 112, and each of the first recess R1 and the second recess R2 may be adjacent to the one end portion of the connection portion 114. For example, the first recess R1 and the second recess R2 may be spaced apart from each other in an extension direction of the extension portion 116 and the circuit wiring 110.

Accordingly, the first recess R1 and the second recess R2 may be formed to be adjacent to the extension portion 116 to prevent an impedance mismatching of the extension portion 116.

In some embodiments, the shortest distance between the connection portion 114 and the first recess R1 and/or the shortest distance between the connection portion 114 and the second recess R2 may be smaller than the shortest distance D3 between the extension portion 116 and the first ground pattern 130. Accordingly, the shortest distance between the connection portion 114 and the first ground pattern 130 may be reduced, so that loss of the signal transmitted to or transmitted from the head portion 112 may be further reduced.

For example, the shortest distance between the connection portion 114 and the first recess R1 and/or the shortest distance between the connection portion 114 and the second recess R2 may be the shortest distance D2 between the connection portion 114 and the first ground pattern 130.

For example, the shortest distance between the connection portion 114 and the first recess R1 and the shortest distance between the connection portion 114 and the second recess R1 may be substantially the same. Accordingly, the impedance matching may be improved, and thus driving reliability of the circuit board may be improved.

Figure 4:
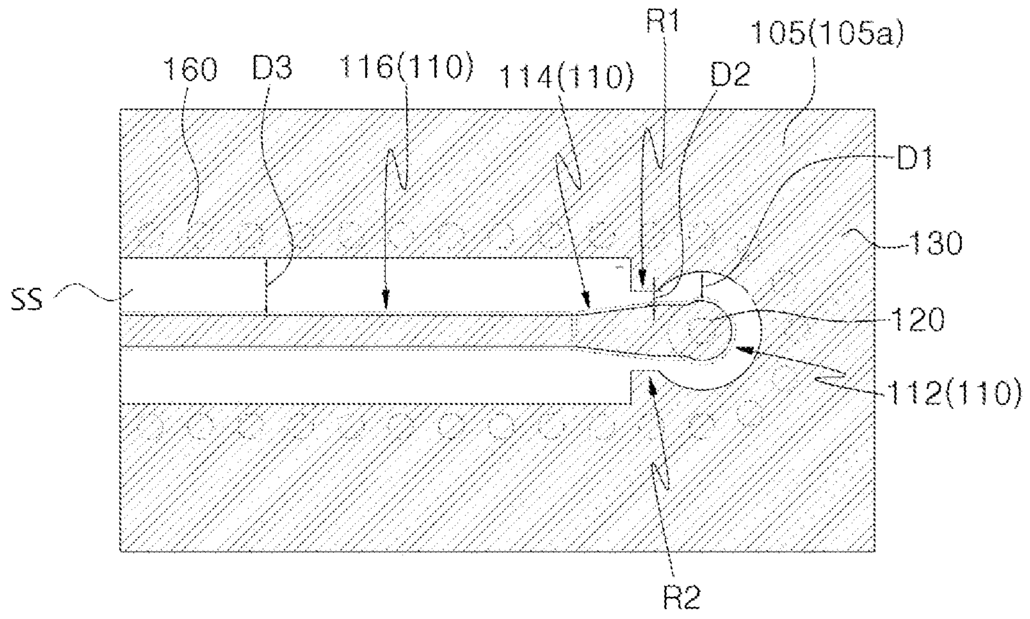
FIG. 4 is a schematic plan view illustrating a circuit board in accordance with exemplary embodiments.

FIG. 4 is a schematic plan view illustrating a circuit board in accordance with exemplary embodiments.

Referring to FIG. 4, the connection portion 114 may include an inclined portion having an increased width in a direction from the extension portion 116 to the head portion 112. Accordingly, a difference between widths of the extension portion 116 and the head portion 112 may be reduced, thereby further suppressing the signal loss.

For example, the shortest distance D2 between the connection portion 114 and the first recess R1 and/or the shortest distance between the connection portion 114 and the second recess R2 may be further reduced by the inclined portion.

In some embodiments, the shortest distance D2 between the connecting portion 114 and the first recess R1 and/or the shortest distance between the connection portion 114 and the second recess R2 may be smaller than the shortest distance between the head portion 112 and the first ground pattern 130. Accordingly, noises around the first via structure 120 may be sufficiently shielded while improving impedance matching.

The circuit board according to the above-described embodiments may be electrically and/or physically connected to the antenna device, the external intermediate structure, the driving IC chip, etc., to serve as an intermediate structure for signal transmission.

For example, the antenna device may include a radiator and a transmission line extending from the radiator, and the transmission line may be electrically connected to one end portion of the extension portion 116 or the via land 140 of the circuit board.

For example, a terminal end of a feeding wiring included in the external intermediate structure may be electrically connected to the one end portion of the extension portion 116 or the via land 140 of the circuit board.

For example, a circuit wiring that may transmit and receive signals from the driving IC chip may be electrically connected to the one end portion of the extension portion 116 or the via land 140 of the circuit board.

The signal loss around the first via structure 120 of the circuit board may be suppressed to provide the circuit board having improved reliability.

Hereinafter, preferred embodiments are proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

Example 1

A COP core layer including a via hole was prepared. The via hole was formed to penetrate the core layer. Copper (Cu) was applied on the core layer, and then patterned to manufacture a circuit board having the same shape as that illustrated in FIGS. 1 and 2.

Example 2

A COP core layer including a via hole was prepared. The via hole was formed to penetrate the core layer. Copper (Cu) was applied on the core layer, and then patterned to prepare a circuit board having the same shape as that illustrated in FIGS. 2 and 4.

Example 3

Figure 5:
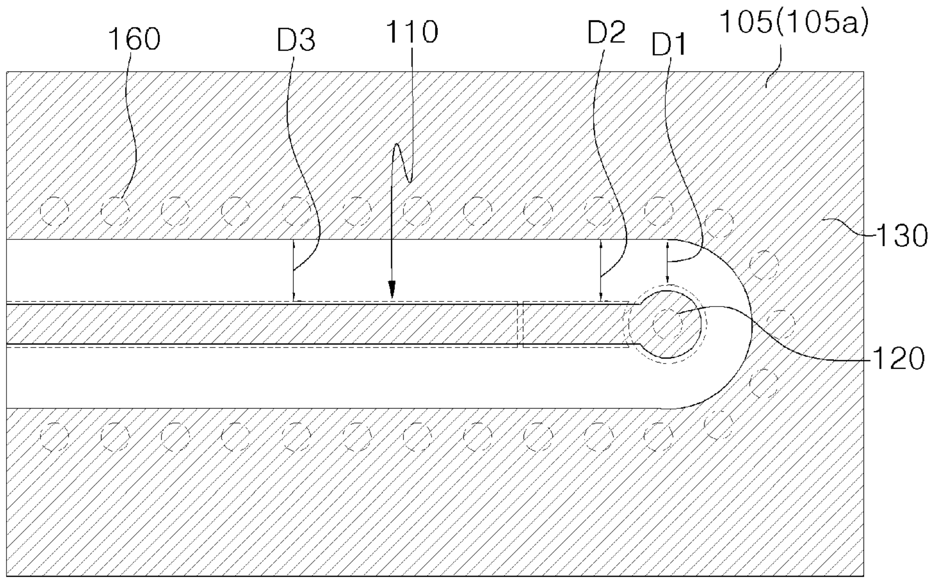
FIG. 5 is a schematic plan view illustrating a circuit board of Example 3.

A COP core layer including a via hole was prepared. The via hole was formed to penetrate the core layer. Copper (Cu) was applied on the core layer, and then patterned to manufacture a circuit board having the same shape as that illustrated in FIGS. 5 and 2.

Specifically, the shortest distance (D2) between the connection portion and the first ground pattern and the shortest distance (D3) between the extension portion and the first ground pattern were the same, and the shortest distance (D1) between the head portion and the first ground pattern was adjusted to be less than the D2 and D3.

Comparative Example

Figure 6:
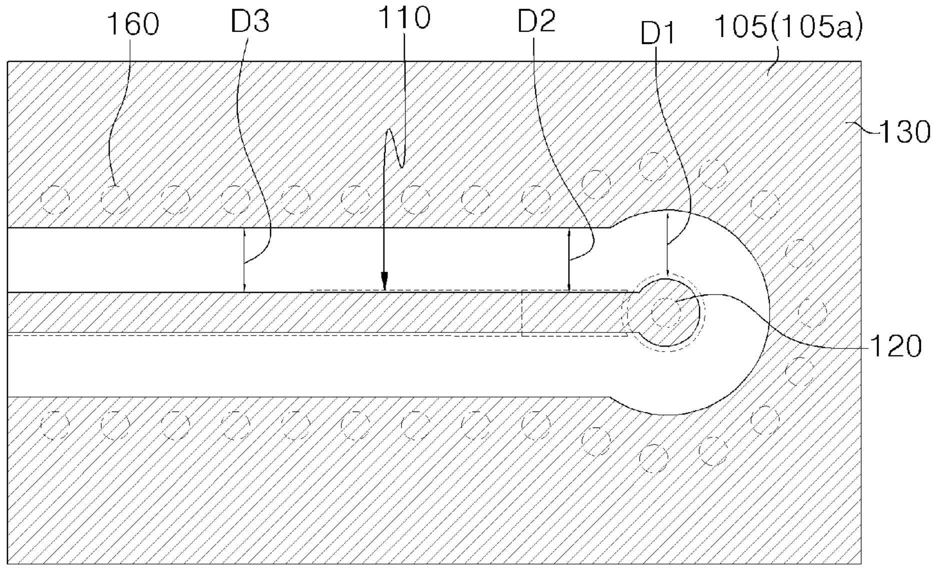
FIG. 6 is a schematic plan view illustrating a circuit board of Comparative Example.

A circuit board having the same shape as that of FIGS. 6 and 2 was manufactured.

Specifically, the shortest distance D1 between the head portion and the first ground pattern was adjusted so that the shortest distance D2 between the connection portion and the first ground pattern and the shortest distance D3 between the extension portion and the first ground pattern were substantially the same.

Experimental Example (1) Return Loss (S11)

A return loss (S11) was measured in a frequency band of 60 GHz by connecting a port to one end of the via land and/or the extension portion of each circuit board manufactured according to Examples and Comparative Example.

A CST simulator (Dassault Systems) was used as a measuring device.

A small value of the return loss S11 can be evaluated as having reduced signal loss.

(2) Insertion Loss (S21)

An insertion loss (S21) was measured in a frequency band of 60 GHz by connecting a port to one end of the via land and/or the extension portion of each circuit board manufactured according to Examples and Comparative Example.

A CST simulator (Dassault Systems) was used as a measuring device.

A small value of the insertion loss S21 can be evaluated as having reduced signal loss.

The results are shown in Table 1 below.

TABLE 1

| | Return loss (S11) (dB) | Insertion loss (S21) (dB) |
|---|---|---|
| Example 1 | −15.22 | −0.82 |
| Example 2 | −24.06 | −0.65 |
| Example 3 | −13.65 | −0.89 |
| Comparative Example | −11.75 | −1.03 |

In Examples, the distance with the first ground pattern from each of the head portion and the connection portion was adjusted as shown in FIGS. 1, 2, 4 and 5. In Comparative Example, the distance between the circuit wiring and the first ground pad was uniformly adjusted as shown in FIG. 6. The circuit board according to Examples has a reduced signal loss compared to that from the circuit board according to Comparative Example.

In Example 2 where the inclined portion having an increasing width from the extension portion to the head portion was included. The signal loss was further decreased.

Figure 7:
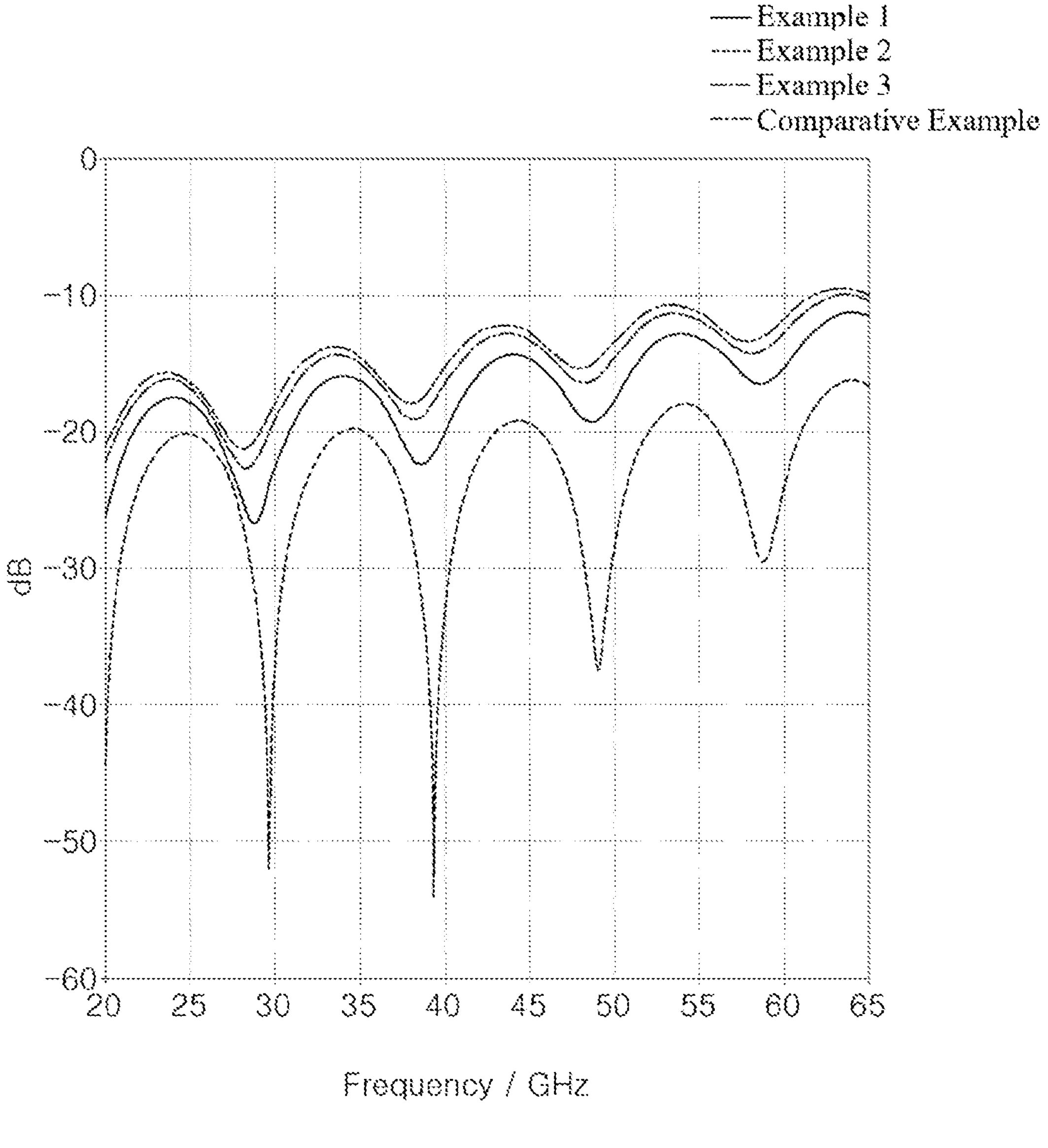
FIGS. 7 and 8 are graphs showing signal intensities according to frequencies from circuit boards of Examples and Comparative Example.
Figure 8:
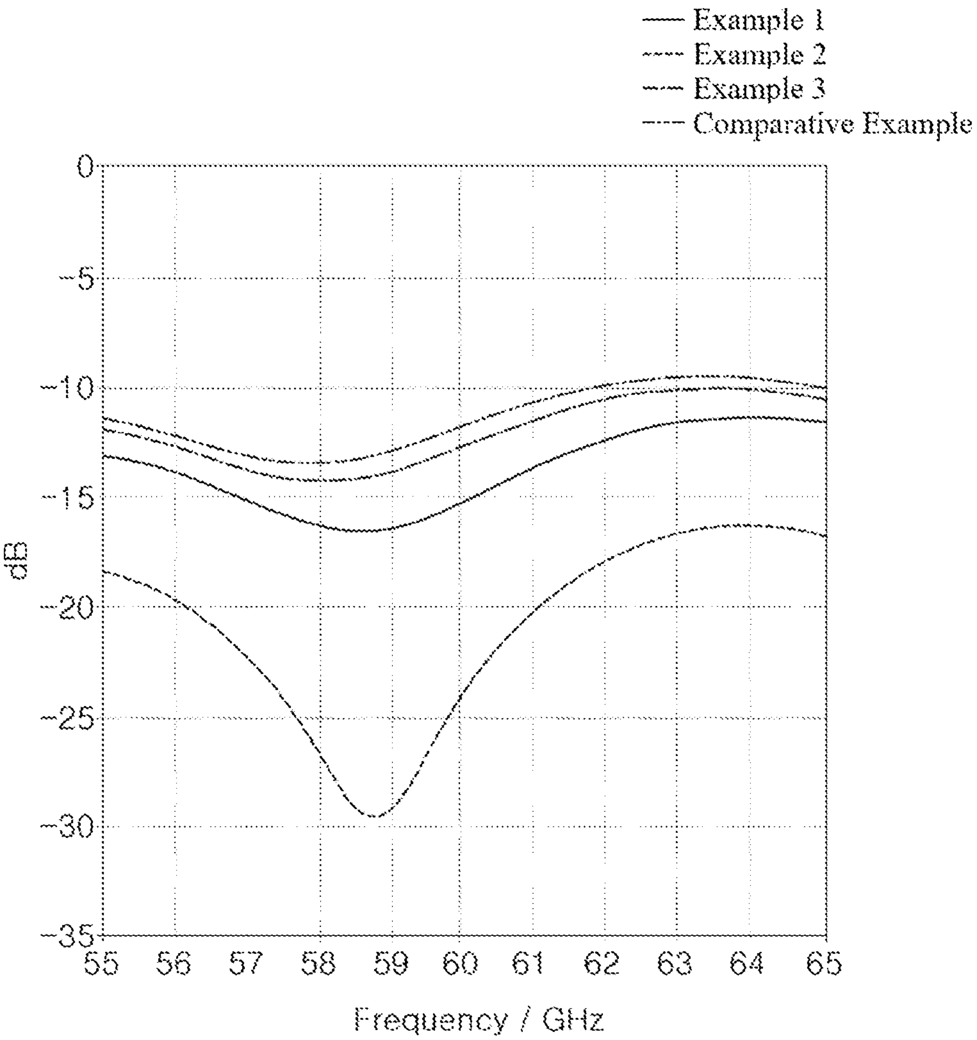

FIGS. 7 and 8 are graphs showing signal intensities according to frequencies from circuit boards of Examples and Comparative Example.

Referring to FIGS. 7 and 8, in Examples 1 to 3, the signal intensities according to frequencies were improved compared to that in Comparative Example. Accordingly, signal transmission properties were improved.

In Example 2 including the inclined portion, the signal intensity at the target frequency was further increased.

What is claimed is:

1. A circuit board comprising:

a core layer;

a first via structure penetrating the core layer;

a circuit wiring disposed on one surface of the core layer, the circuit wiring comprising a head portion in contact with the first via structure, a connection portion extending from the head portion, and an extension portion electrically connected to the head portion through the connection portion; and a first ground pattern disposed on the one surface of the core layer and disposed around the circuit wiring to be spaced apart from the circuit wiring, wherein a shortest distance between the extension portion and the first ground pattern is greater than a shortest distance between the head portion and the first ground pattern, and the connection portion includes an inclined portion having an increasing width in a direction from the extension portion to the head portion, and the head portion, the connection portion including the inclined portion and the extension portion are integral member disposed only on the one surface of the core layer, wherein a width of the head portion is greater than the maximum width of the connection portion.

2. The circuit board of claim 1, further comprising a via land disposed on the other surface of the core layer and electrically connected to the head portion through the first via structure.

3. The circuit board of claim 2, wherein the via land is formed integrally with the head portion and the first via structure.

4. The circuit board of claim 2, further comprising a second ground pattern disposed on the other surface of the core layer and disposed around the via land to be spaced apart from the via land.

5. The circuit board of claim 4, further comprising a second via structure penetrating the core layer to electrically connect the first ground pattern and the second ground pattern.

6. The circuit board of claim 1, wherein the shortest distance between the extension portion and the first ground pattern is greater than a shortest distance between the connection portion and the first ground pattern.

7. The circuit board of claim 1, wherein the width of the head portion is greater than a width of the extension portion.

8. The circuit board of claim 1, wherein a width of the connection portion is greater than or equal to a width of the extension portion.

9. The circuit board of claim 1, further comprising a separation space in a trench shape formed between the first ground pattern and the circuit wiring.

10. The circuit board of claim 1, wherein the first ground pattern includes a first recess and a second recess formed around the connection portion to face each other with the connection portion there between.

11. The circuit board of claim 10, wherein the connection portion includes one end portion directly connected to the head portion, and the first recess and the second recess are adjacent to the one end portion of the connection portion.

12. The circuit board of claim 10, wherein a shortest distance between the connection portion and the first recess and a shortest distance between the connection portion and the second recess are each smaller than the shortest distance between the extension portion and the first ground pattern.

13. The circuit board of claim 10, wherein the first recess and the second recess are each spaced apart from the extension portion in an extension direction of the circuit wiring.

14. The circuit board of claim 10, wherein a shortest distance between the connection portion and the first recess and a shortest distance between the connection portion and the second recess are each smaller than the shortest distance between the head portion and the first ground pattern.

* * * * *